United States Patent
Manin et al.

(10) Patent No.: US 11,784,621 B2
(45) Date of Patent: Oct. 10, 2023

(54) TUNABLE SLOPE EQUALIZER

(71) Applicant: Gilat Satellite Networks Ltd., Petah Tikva (IL)

(72) Inventors: Konstantin Manin, Ashdod (IL); Carmy Klein, Modiin (IL); Amir Halperin, Givataim (IL)

(73) Assignee: Gilat Satellite Networks Ltd., Petah Tikva (IL)

( * ) Notice: Subject to any disclaimer, the term of this patent is extended or adjusted under 35 U.S.C. 154(b) by 43 days.

(21) Appl. No.: 17/509,599

(22) Filed: Oct. 25, 2021

(65) Prior Publication Data

US 2022/0131512 A1  Apr. 28, 2022

Related U.S. Application Data (60) Provisional application No. 63/105,609, filed on Oct. 26, 2020.

(51) Int. Cl.
| | |
|---|---|
| *H04B 3/04* | (2006.01) |
| *H03G 5/16* | (2006.01) |
| *H03G 5/28* | (2006.01) |
| *H04L 27/01* | (2006.01) |
| *H01P 1/18* | (2006.01) |

(52) U.S. Cl.
CPC ............ *H03G 5/165* (2013.01); *H01P 1/182* (2013.01); *H03G 5/28* (2013.01); *H04L 27/01* (2013.01)

(58) Field of Classification Search
CPC .......... H03G 5/165; H03G 5/28; H03G 5/025; H01P 1/182; H04L 27/01; H04L 25/03; H04L 25/03343; H04B 3/04; H04B 3/14
USPC .......... 333/18, 28 R; 330/304, 305; 375/229, 375/230, 232
See application file for complete search history.

(56) References Cited

U.S. PATENT DOCUMENTS

| | | | | |
|---|---|---|---|---|
| 3,699,480 | A * | 10/1972 | Mueller | H01P 9/003 333/24 C |
| 6,580,327 | B1 * | 6/2003 | Joffe | H03F 3/45475 330/306 |
| 8,363,710 | B2 * | 1/2013 | Luo | H03H 11/1291 375/232 |

\* cited by examiner

*Primary Examiner* — Hai L Nguyen
(74) *Attorney, Agent, or Firm* — Banner & Witcoff, Ltd.

(57) ABSTRACT

A tunable slope equalizer comprising a waveguide (e.g., rectangular waveguide) and posts (e.g., cylindrical posts) configured to move inside the internal cavity of the waveguide is presented. The degree of depth the posts may be inserted into the cavity of the waveguide may determine the orientation of the frequency response slope, e.g., positive or negative, and the maximum (or approximately maximum) insertion loss at minimum (or approximately minimum) or maximum (or approximately maximum) operating frequency, respectively. Being a mechanical device, the tunable slope equalizer may be fabricated at a relatively higher level of precision, leading to lower variances in performance over production.

20 Claims, 5 Drawing Sheets

TUNABLE SLOPE EQUALIZER

CROSS-REFERENCE TO RELATED APPLICATIONS

This application is a non-provisional of and claims priority to U.S. Provisional Patent Application No. 63/105,609, filed Oct. 26, 2020, which is hereby incorporated by reference in its entirety.

TECHNICAL FIELD

Aspects of the disclosure pertain to the fields of power amplifiers and equalizers.

BACKGROUND

Power amplifiers (PAs) are used in communication systems for amplifying transmission signals to desired power levels. In some communication systems, the PAs may operate over wide frequency bands (wideband operation). For example, a PA for a communication system in the Ka-band may operate over a frequency band of 2.5 GHz (e.g., 27.5-30.0 GHz). However, a PA's gain may decrease with the increase in operating frequency, which may degrade its performance at higher operating frequencies. Conventional equalizers are generally unable to adequately counteract this performance degradation.

BRIEF SUMMARY

The following presents a simplified summary in order to provide a basic understanding of some aspects of the disclosure. The summary is not an extensive overview of the disclosure. It is neither intended to identify key or critical elements of the disclosure nor to delineate the scope of the disclosure. The following summary merely presents some aspects of the disclosure in a simplified form as a prelude to the description below.

Aspects of the disclosure describe a tunable slope equalizer comprising a waveguide and a tuning element configured to move inside a rectangular cavity of the waveguide for at least the purpose of tuning the frequency response of the tunable slope equalizer. In some examples, the tuning element may be coupled to a motor. The tuning element may comprise two or more posts (e.g., cylindrical posts) that be inserted to a varying degree of depth into the internal cavity of the waveguide. The two or more posts may be inserted into the internal cavity of the waveguide through bores that may be located on a side of the waveguide.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION

A characteristic of a power amplifier (PA) is its gain. However, gain may vary over the PA's operating conditions (e.g., frequency, temperature). In particular, wideband operation may pose a challenge for PAs. As most active components, passive components and electronic circuits may exhibit a decrease in gain (or an increase in insertion loss) with the increase in operating frequency, it may be difficult to maintain a same or similar gain for the PA over the band of operation. In many cases the PA's gain tends to decline with the increase in operating frequency. Such gain variations vs. frequency (and/or vs. temperature) may degrade the performance of a communication system that uses such PAs.

One method for stabilizing a PA's gain over its operation frequency range is to include a tunable sloped pass-band equalizer filter within the PA. Such equalizer can be designed to have a frequency response opposite (or approximately opposite) to that of the amplifiers within the PA (e.g., higher loss at lower frequencies than at higher frequencies), so that the overall frequency response of the PA would be equalized (or approximately equalized), e.g., the PA's gain would be about the same (with some variations) over the operation frequency range.

However, designing and implementing a tunable equalizer may be challenging. For example, an implementation of a tunable equalizer may comprise a resonance circuit, with a PIN diode resistance control, on a planar structure (such as a micro-strip, substrate integrated waveguide (SIW), and/or other types of planar structures). However, high signal insertion loss, dielectric instability, parasitic effect of the package, and changes in temperature of the PIN diode may have adverse effects on the equalizer's performance as the operating frequency increases. Furthermore, variances over production in the properties of electronic components may lead to different frequency responses for the tunable equalizers between produced units. As a result, a PA unit may have a non-optimal overall frequency response.

Examples described below may attempt to solve these problems associated with tunable equalizers and provide solutions to other problems as well. It should however be understood that these examples are used to illustrate various aspects of the disclosure and should not be considered limiting.

Figure 1:
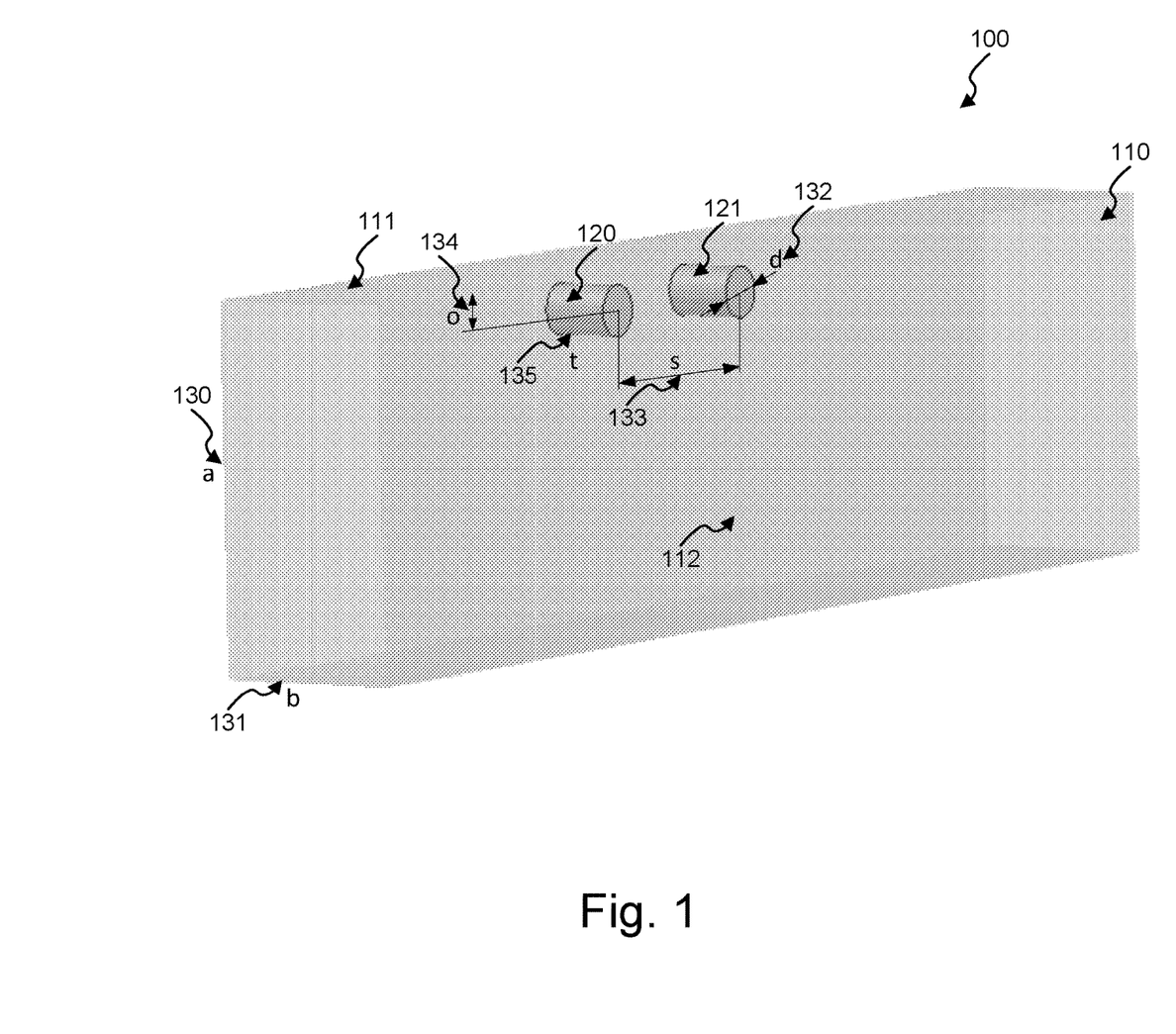
FIG. 1 shows an illustration of a waveguide and of a tuning element in accordance with aspects of the disclosure.

In reference to FIG. 1, a tunable slope equalizer 100 is shown. In some examples, the slope (frequency response) of the equalizer 100 may be tuned to be a positive slope (e.g., where insertion loss decreases as frequency increases) or a negative slope (e.g., where insertion loss increases as frequency increases). In some examples, the tunable slope equalizer 100 may comprise a waveguide 110 (e.g., a rectangular waveguide) and a tuning element (e.g., comprising posts 120 and 121) configured to move inside the (rectangularly-shaped) cavity of the waveguide 110 for at least the purpose of tuning the frequency response of the tunable slope equalizer 100. The waveguide 110 may be any structure that forms a cavity through which waves (e.g., electromagnetic waves) may be guided from one end of the cavity to another end of the cavity. The internal surface(s) (e.g., internal walls) of the waveguide 110 forming the cavity may be made from a material (e.g., metallic material) that reflects the waves so as to guide the waves with minimal attenuation (loss of wave energy). A rectangular waveguide may have a rectangular-shaped cavity (e.g., cavity formed from four internal walls). The outer-shape of the waveguide may be rectangular as well, but other outer-shapes may also be used.

In some examples, the tuning element may be coupled to a motor (not shown in FIG. 1), which may enable a dynamic tuning (e.g., real time) of the frequency response of the tunable slope equalizer 100. For example, tuning the frequency response of the tunable slope equalizer 100 in real time may be in response to changes in frequency response of a PA, e.g., due to temperature changes. Being a mechanical device using a waveguide, the tunable slope equalizer 100 may provide the waveguide's advantages (e.g., lower insertion loss, higher quality factor, higher power handling, and higher repeatability), and its performance may be less affected by dielectric instability, parasitic effects, and temperature changes. Furthermore, as the tunable slope equalizer 100 may be fabricated at a relatively higher level of precision (e.g., in accord with the dimensions specified further herein), variance in performance over production may be less likely.

The tuning element previously mentioned may comprise two or more posts (e.g., two cylindrical posts 120 and 121). The posts may be made of, e.g., a metallic material (for example, aluminum, copper, or any other type of metal). In some examples, the cylindrical posts 120 and 121 may have same dimensions (e.g., diameter and length). The cylindrical posts 120 and 121 may be inserted to a varying degree of depth into the internal cavity of the waveguide 110. In some examples, the cylindrical posts 120 and 121 may be inserted together into the internal cavity of the waveguide, e.g., to about a same degree of depth. In such examples, a single control element (e.g., a motor) may be used for controlling both posts 120 and 121 (e.g., simultaneously controlling both posts).

The posts 120 and 121 may be inserted into the internal cavity of the waveguide 110 through corresponding bores (e.g., drilled holes) that may be located on a side of the waveguide 110. In some examples, said posts 120 and 121 may be inserted through corresponding bores via a side 112 of the waveguide 110 (e.g., via one of the four walls of a rectangular waveguide) corresponding to the width dimension of the waveguide 110, e.g., so that the movement of the posts 120 and 121 inside the waveguide 110 may be in parallel to the side 111 of the waveguide 110 corresponding to its height dimension. It may be noted that, considering the rectangular profile of a waveguide 110, the height dimension (b) of the waveguide 110 corresponds to the dimension in the direction of the shortest edge (here, 131) of the waveguide 110 and the width dimension (a) of the waveguide 110 corresponds to the dimension in the direction of the longer edge (here, 130) of the waveguide 110. Using linear movement, the depth of inserting the posts 120 and 121 into the internal cavity of waveguide 110 may be controlled. Controlling said depth may allow controlling the gain slope of the tunable slope equalizer 100.

The frequency response of the tunable slope equalizer 100 may be controlled based on several parameters. These parameters may include, for example, the dimensions of the waveguide 110 (e.g., its width (a, 130) and height (b, 131)), the diameter (d, 132) of the cylindrical posts 120 and 121, the distance (s, 133) between the cylindrical posts 120 and 121, the distance (o, 134) in the width dimension between the cylindrical posts 120 and 121 and the internal plane (in the height and length dimensions) of the nearest side 111 of the waveguide 110, and the degree of depth (t, 135) the cylindrical posts 120 and 121 are inserted into the cavity of the waveguide at a particular time. In some examples, the width 130 and height 131 (e.g., the profile) of the waveguide 110, the diameter 132 of the cylindrical posts 120 and 121, and the distance 133 between the cylindrical posts 120 and 121 may be determined in accordance with a frequency band that the tunable slope equalizer 100 may be configured to operate in, e.g., Ka-band, Ku-band, etc. Further, in some examples, the distance 134 of the cylindrical posts 120 and 121 from the internal plane of the nearest side 111 of the waveguide 110 may determine the frequency response slope range, e.g., the difference in gain between the highest gain (or approximately highest gain) and the lowest gain (or approximately lowest gain) over the frequency range of operation.

Figure 2:
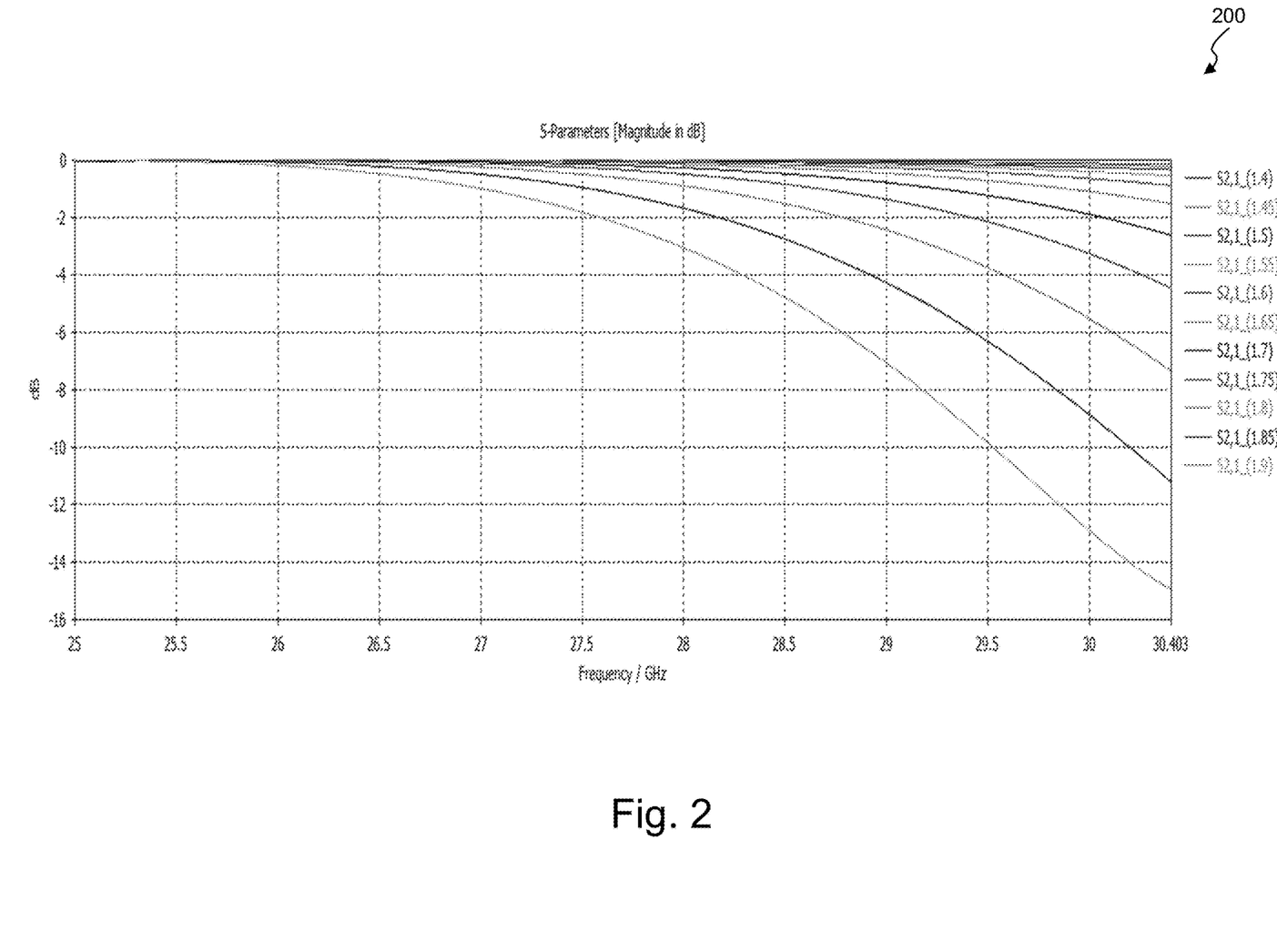
FIG. 2 shows an example negative frequency response in accordance with aspects of the disclosure.
Figure 3:
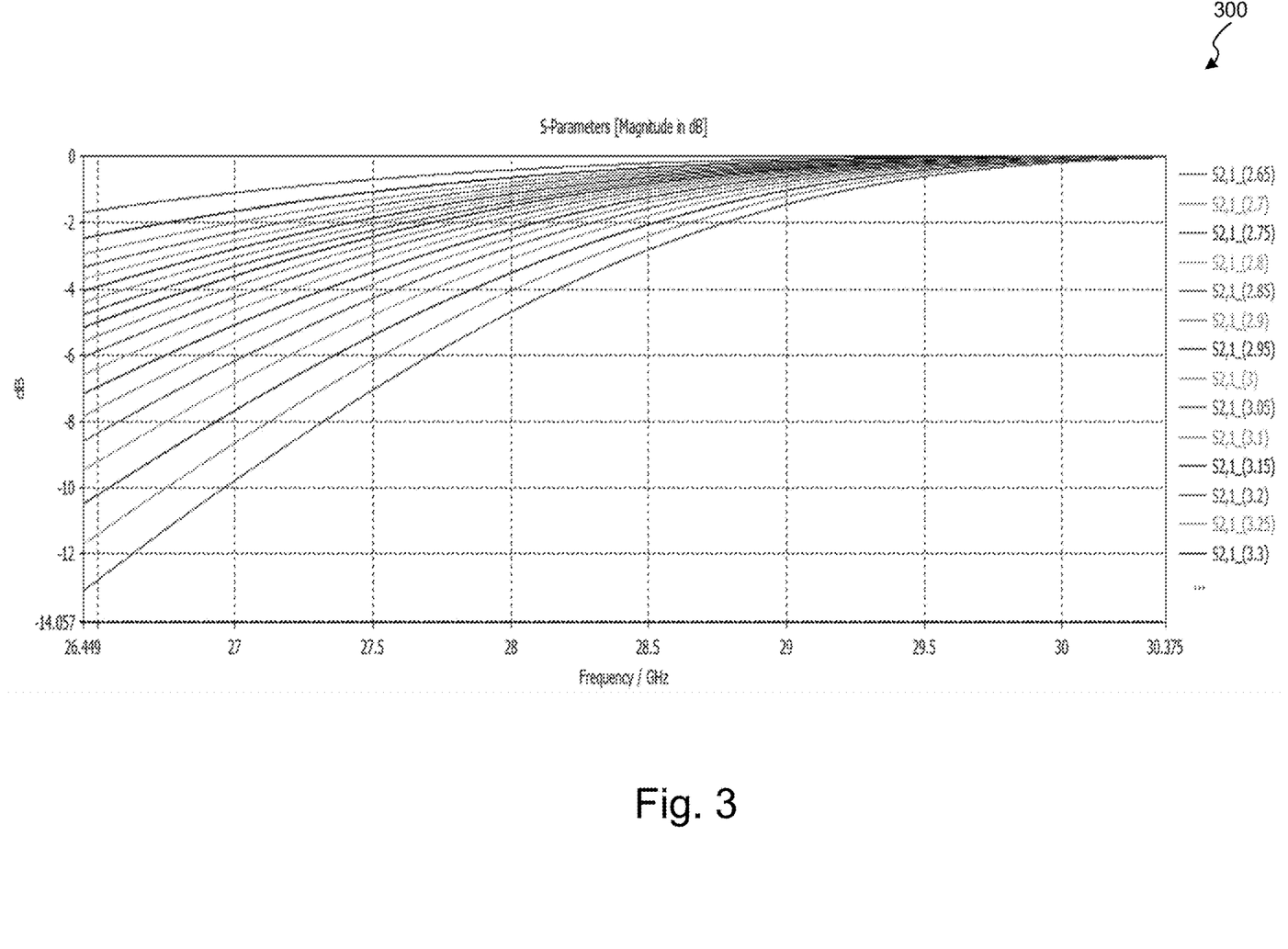
FIG. 3 shows an example positive frequency response in accordance with aspects of the disclosure.

The degree of depth 135 that the cylindrical posts 120 and 121 are inserted, at a particular time, into the cavity of the waveguide 110 may determine the orientation of the frequency response slope, e.g., positive or negative, and the maximum (or approximately maximum) insertion loss at minimum (or approximately minimum) or maximum (or approximately maximum) operating frequency, respectively. For example, graph 200 in FIG. 2 shows an example of a negative frequency response slope, wherein the tunable slope equalizer 100's gain (e.g., in dB) may be designated on the vertical axis and the operation frequency (e.g., in GHz) may be designated on the horizontal axis. A line in graph 200 may correspond to a degree of depth 135, for example, as designated (e.g., in millimeters) in the graph legend (e.g., 1.4, 1.45, etc.). As graph 200 shows, tunable slope equalizer 100's gain may decrease (e.g., its insertion loss may increase) as the operating frequency increases, and the maximum (or approximately maximum) insertion loss at a maximum (or approximately maximum) operating frequency (e.g., 30 GHz) may be higher as the degree of depth 135 becomes higher. In another example, graph 300 in FIG. 3 shows an example of a positive frequency response slope, wherein the tunable slope equalizer 100's gain (e.g., in dB) may be designated on the vertical axis and the operation frequency (e.g., in GHz) may be designated on the horizontal axis. A line in graph 300 may correspond to a degree of depth 135, for example as designated (e.g., in millimeters) in the graph legend (e.g., 2.65, 2.7, etc.). As graph 300 shows, tunable slope equalizer 100's gain may increase (e.g., its insertion loss may decrease) as the operating frequency increases, and the maximum (or approximately maximum) insertion loss at a minimum (or approximately minimum) operating frequency (e.g., 27 GHz) may be higher as the degree of depth 135 becomes lower.

Having the degree of depth 135 determining the orientation of the frequency response slope and the maximum (or approximately maximum) insertion loss at minimum (or approximately minimum) or maximum (or approximately maximum) operating frequency may allow a tunable slope equalizer 100 to be used for both positive slopes and negative slopes. In some examples, the degree of depth 135 that the cylindrical posts 120 and 121 may be inserted into the cavity of the waveguide 110 may vary between zero (e.g., when the circular surfaces (or ends) of the cylindrical posts 120 and 121 may be at about the same plane as the internal plane of the side through which the posts 120 and 121 are inserted into the cavity of the waveguide 110) and the height of the waveguide (e.g. when the circular surfaces (or ends) of the cylindrical posts 120 and 121 may be touching the internal side of the waveguide 110 opposite to the side through which the posts 120 and 121 are inserted into the cavity of the waveguide 110). In some examples, for degrees of depth 135 that are smaller than about half the waveguide cavity's height (e.g., less than half the distance of the shortest edge 131), the tunable slope equalizer 100 may exhibit a negative slope, and for degrees of depth 135 that are larger than about half the waveguide cavity's height (e.g., more than half the distance of the shortest edge 131), the tunable slope equalizer 100 may exhibit a positive slope. For example, when the posts extend less than about half way across the cavity (e.g., in the height dimension described above), the tunable slope equalizer 100 may cause a frequency response having a negative slope, but when the posts extend more than about half way across the cavity (e.g., in the height dimension described above), the tunable slope equalizer 100 may cause the frequency response to have a positive slope.

In some examples, the movement of the cylindrical posts 120 and 121 (e.g., inside the cavity of the waveguide 110) may be controlled by a manual micrometer. In some examples, the movement may be controlled by a stepper motor linear actuator. Further, the motion controller (e.g., the micrometer, the stepper motor, and/or any other type of motion controller) may be configured to move the cylindrical posts 120 and 121 in steps within a predetermined limit based on a granularity at which the slope of the tunable slope equalizer 100 may be tuned. For example, in some embodiments, a step of up to 50 microns may allow slope tuning granularity of about 1 dB.

Figure 4A:
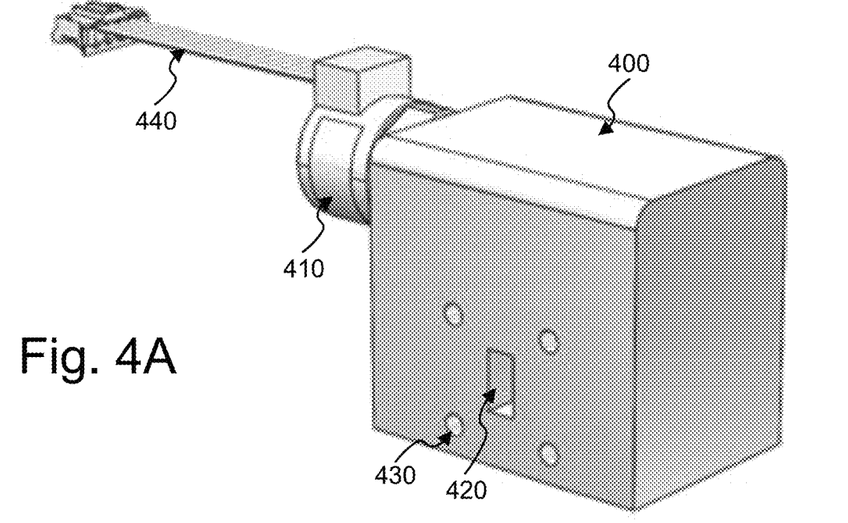
FIGS. 4A and 4B show two views of an example tunable slope equalizer in accordance with aspects of the disclosure.
Figure 4B:
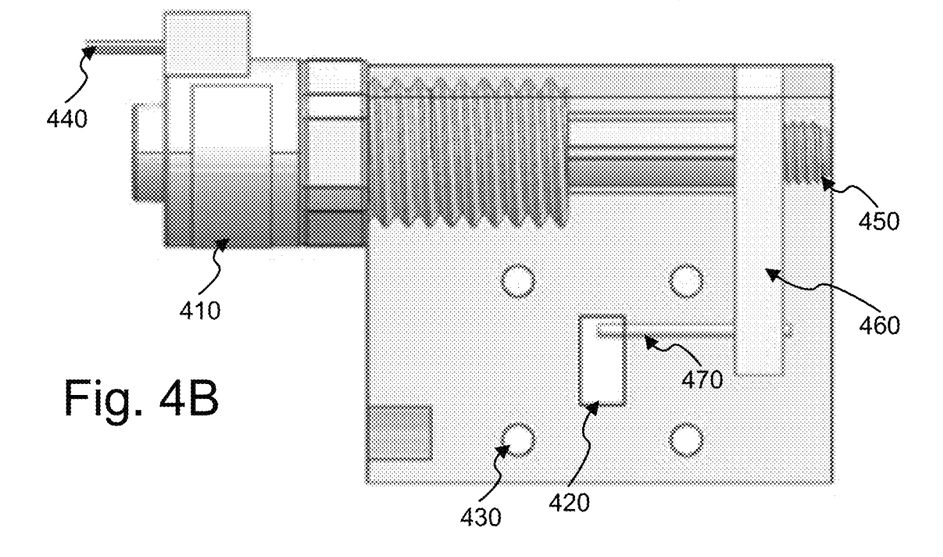

FIG. 4A shows an external view illustration and FIG. 4B shows a cross-section illustration of an example tunable slope equalizer 400. Equalizer 400 may comprise a stepper motor 410 and a waveguide 420 having a (rectangular) cavity and two waveguide ports (e.g., one port at the front of equalizer 400 (e.g., side with screw holes 430) and the other port at the rear of equalizer 400 (not shown in FIG. 4B)). Equalizer 400 may further comprise control circuitry (e.g., wires and header 440) for delivering electricity (e.g., DC voltage) and control signals (e.g., from a controller, such as a microprocessor or microcontroller) to operate the stepper motor 410 (e.g., control the stepper motor 410 to rotate clockwise and/or counterclockwise).

In some embodiments, where equalizer 400 may be used in a communication terminal, one waveguide port may be coupled to an output of an upconverter (e.g. corresponding to a frequency range that equalizer 400 may be configured to operate at), and the other waveguide port may be coupled to an input of a high power amplifier (HPA). That way, attenuation that equalizer 400 may inflict on a transmitted signal may be compensated for by increasing the upconverter output power and/or controlling the HPA gain.

Equalizer 400 may further comprise a screw 450, a plate 460, and posts 470 (e.g., the two cylindrical posts 120 and 121 as previously described). FIG. 4B shows only one cylindrical post since in the cross-section view of FIG. 4B one post obscures the other. The screw 450 may be coupled to the stepper motor, so that movement (e.g., rotation) of the stepper motor 410 may cause corresponding (e.g., proportional) rotation of the screw 450. The plate 460 may be coupled to the screw 450. For example, plate 460 may comprise a screw thread through which screw 450 may be inserted. As the screw 450 turns, the plate 460 may move forward or backward (e.g., left and right in reference to the view of FIG. 4B), in a manner corresponding to the rotation direction of the screw 450. Cylindrical posts 470 may be coupled to the plate 460 on one end and inserted into the cavity of waveguide 420 on their other hand. In some examples, the posts 470 may be projections or protrusions from the plate 460, such that the two posts are integral to the plate 460. Thus, as the plate 460 moves forward and backwards, the cylindrical posts 470 may move with the plate 460, and their tips (which may be inserted inside the cavity of waveguide 420) may move forward and backward as well. Thus, the degree of depth that the cylindrical posts 470 may be inserted into the cavity of waveguide 420 may be controlled, wherein said degree of depth may affect the frequency response of the tunable slope equalizer 400, as previously described.

In an aspect of the disclosure, a communication terminal (e.g., VSAT) may comprise a power amplifier and a tunable slope equalizer 100 coupled to the power amplifier. In some examples, the tunable slope equalizer 100 may comprise a waveguide 110 with a rectangular cavity and cylindrical posts 120 and 121 configured to move inside the internal cavity of the waveguide 110 for at least the purpose of tuning the frequency response of the tunable slope equalizer 100. The tunable slope equalizer 100 may further comprise a stepped motor linear actuator for at least the purpose of controlling the motion of the cylindrical posts 120 and 121. The communication terminal may further comprise a controller configured to control the tunable slope equalizer 100, for example by controlling the stepped motor linear actuator of the tunable slope equalizer 100. In some examples, the controller may comprise a modem, wherein the modem may be coupled to the power amplifier and configured to transmit information (e.g., to another terminal or communication station, either directly or via a relay such as a satellite) using the power amplifier. In some examples, the controller may be provided, in advance of controlling the equalizer, information associated with the frequency response of the power amplifier. In other examples, the controller may be configured to receive, during operation of the communication terminal, the information associated with the frequency response of the power amplifier. In some examples, the controller may be further configured to receive information regarding the operation temperature of the power amplifier, wherein the operation temperature may influence the frequency response of the power amplifier. The controller may be further configured to determine a setting for the tunable slope equalizer 100 in accordance with an expected frequency response of the power amplifier, and control the tunable slope equalizer 100 (e.g., through controlling the stepped motor linear actuator) to apply the determined setting.

Figure 5:
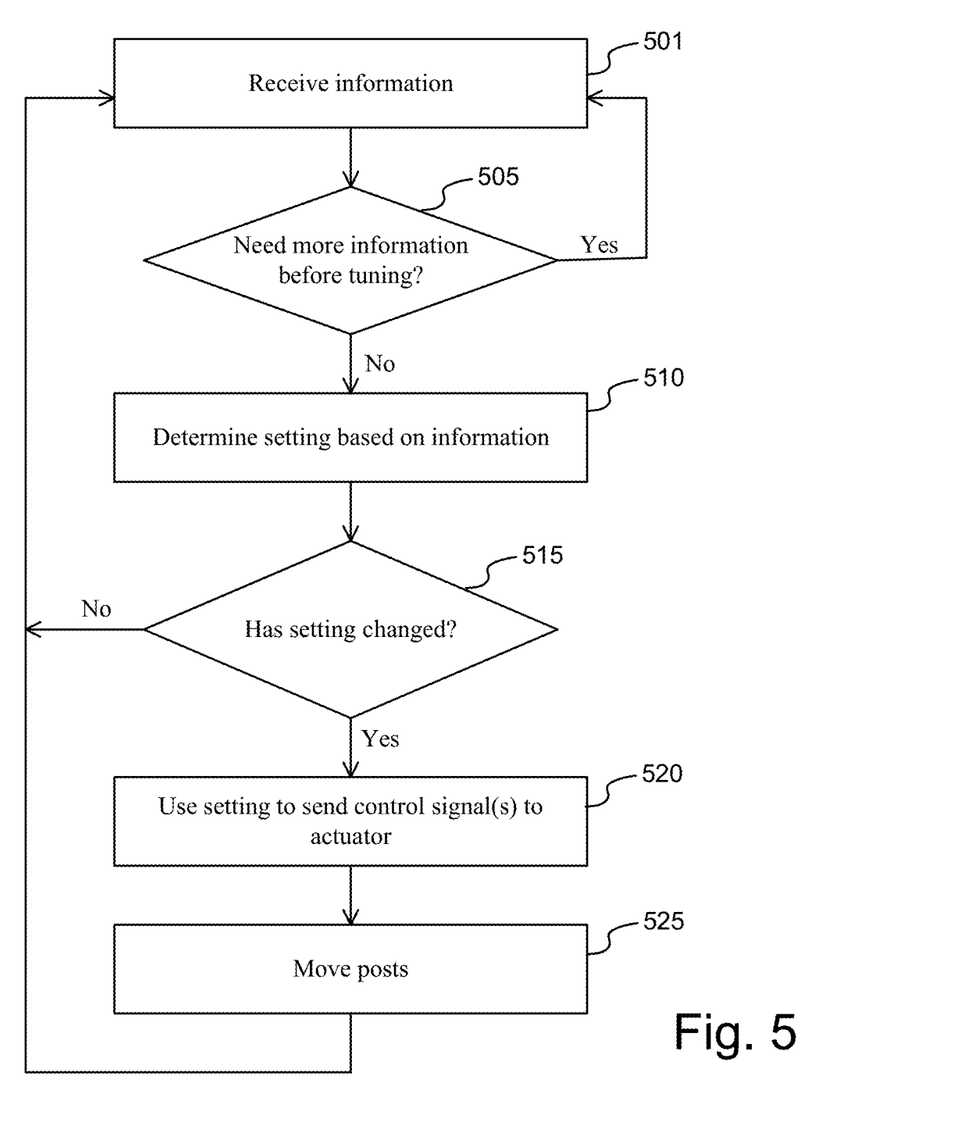
FIG. 5 illustrates a flow chart in accordance with aspects of the disclosure.

In another aspect of the disclosure, a method for tuning the tunable slope equalizer 100 is provided with respect to FIG. 5. The method may begin in response to various triggering events, such as a power up event (e.g., powering up of a communication terminal comprising the equalizer, powering up of the equalizer's controller, etc.), a temperature change, an operating frequency change, the start of a communication session, etc. In the example of FIG. 5, the method begins with a step 501 in which information is received. The information may be received by a device, such as a controller of a communication terminal using the equalizer 100. This information may include real-time data or stored data. For example, this information may include a temperature of a power amplifier that may be received from a sensor. The information may include a frequency or range of frequencies (e.g., 27.5-30 GHz) of one or more communications signals being transmitted by a communication terminal using the equalizer 100. Such operating frequency information may be detected or provided by another device that generates the one or more communications signals. The received information may include information about a current position of the posts of the equalizer (e.g., information indicating a degree of depth into the cavity of the posts or a current setting that was most recently used for controlling the posts). This position information may be received from a device that detects the position of the posts (e.g., an optical sensor), actuator (e.g., motor), or other component (e.g., plate 460 or screw 450) from which the depth of the posts may be derived, or it may be received by reading a current setting (e.g., from memory of the controller that operates the actuator (e.g., motor) that moves the posts). For example, step 501 may include retrieving a setting from the actuator indicating its current position or reading, from memory (e.g., general memory of the communication terminal or memory internal to the controller), the setting that was last provided to the actuator to control the actuator's position. The information received at step 501 may also include configuration information associated with the equalizer 100, such as the diameter of the posts 120 and 121, the distance between the posts, the position/location of the posts within the cavity of the waveguide 110, the dimensions of the cavity of the waveguide 110 (e.g., width, length, and height of the waveguide's cavity), or any other parameter that is discussed herein or that indicates a characteristic (e.g., size, shape, material, etc.) of the equalizer 100.

Following step 501, step 505 may be performed to determine whether more information is needed before making a determination to tune the equalizer. Step 505 may include the device (e.g., controller) determining whether it has sufficient information to tune the equalizer. The amount or type of information needed may vary in different embodiments. For example, temperature information may be required in some embodiments before the device will proceed with tuning the equalizer 100. Alternatively, in some embodiments, the device will proceed with tuning the equalizer 100 based on the information it has about the configuration of the equalizer 100 even if it does not receive temperature information. Similarly, the device may or may not proceed without frequency information of the communications signals passing through the equalizer 100. If the device determines that more information is needed (Yes at step 505), it may return to step 501 to receive (or attempt to receive) the missing information. Otherwise, if the device determines that no more information is needed (No at step 505), the method may proceed to step 510.

In step 510, a setting may be determined based on the information received in step 501. For example, the device (e.g., the controller) may determine a setting for controlling an actuator to move the posts to a position associated with the setting. For example, a setting of '1' may indicate that the actuator is to move the posts to a first position, which may correspond to a first degree of depth (e.g., 1.4 mm in FIG. 2). As another example, a setting of '2' may indicate that the actuator is to move the posts to a second position, which may correspond to a second degree of depth (e.g., 1.45 mm in FIG. 2). The determination of the setting in step 510 may include determining the setting is 'n' (where n is an integer such as 1, 2, 3, etc.) based on determining that a temperature (indicated by received temperature information) is within a predefined temperature range and that an operating frequency is within a predefined operating frequency range. One or more tables (or other similar data structures stored in memory) setting forth such predefined ranges may be used for this determination.

After the setting is determined in step 510, a step 515 may be performed to determine whether the setting has changed since the last time the setting was determined. This step 515 may include reading from memory the previous setting or retrieving the previous setting from the actuator (or another device for controlling the actuator). If the setting has not changed, then there might be no reason to send control signals to the actuator based on the setting as it can be expected that the posts are already in the appropriate position (e.g., the equalizer is tuned as desired). In this case (No at step 515), the method may return to step 501 to receive updated information that might result in determining a changed setting. If the setting has changed (Yes at step 515), the method may proceed to step 520.

At step 520, the setting determined in step 510 is used to send one or more control signals to the actuator. In some cases, the control signals may include the setting itself. Alternatively, the control signals may include other information that instructs the actuator to move the posts to the desired depth within the cavity. For example, the device may translate the setting into one or more control signals that the connected actuator can interpret for determining which direction to move and/or by how much. In some examples, sending the control signal(s) may include supplying power to the actuator for a predetermined period of time.

In response to the control signal(s) sent at step 520, the actuator (e.g., a motor such as a stepper motor) may cause the posts to move to a particular (e.g., target) position within the cavity of the waveguide at step 525. This may include controlling the actuator to turn a screw that causes the posts to extend across the cavity by a particular distance, which may be greater or less than their current distance. That is, the actuator may move the posts further into the cavity or retract the posts so that they extend into the cavity by a lesser distance.

As shown in FIG. 5, after the posts are moved to the target (e.g., desired) position, the method may return to step 501 to receive updated information in case the equalizer should be further tuned. In some examples, a predetermined amount of time may be required to lapse before step 501 is repeated and updated information is received. Or, the method may return to step 501 and wait for a triggering event (e.g., a temperature change) before the method of FIG. 5 is repeated. Alternatively, the method may end after step 525, such that only one iteration is performed for one triggering event (e.g., powering up of the communication terminal or particular component therein, such as the controller or power amplifier).

Accordingly, by way of the example method of FIG. 5, the device (e.g., a controller) may cause two or more posts to move within a cavity of a waveguide. Moreover, the movement may be performed automatically and in real-time in response to various parameters, such that the equalizer is tuned appropriately (e.g., to stabilize a power amplifier's gain).

It should be understood that one or more steps in the method of FIG. 5 may be omitted. For example, step 505 may be omitted such that the device attempts to determine a setting based on whatever information is received. As another example, step 515 may be omitted such that the device sends the determined setting to the actuator even if it has not changed since the last time the setting was sent to the actuator. It should also be understood that some steps may be combined and that additional steps may be included.

Various aspects of the disclosure may be embodied as one or more methods, systems, apparatuses (e.g., components of a satellite communication network), and/or computer program products. Accordingly, those aspects may take the form of an entirely hardware embodiment, an entirely software embodiment, an entirely firmware embodiment, or an embodiment combining firmware, software, and/or hardware aspects. Furthermore, such aspects may take the form of a computer program product stored by one or more computer-readable storage media having computer-readable program code, or instructions, embodied in or on the storage media. Any suitable computer readable storage media may be utilized, including hard disks, CD-ROMs, optical storage devices, magnetic storage devices, and/or any combination thereof. In some embodiments, one or more computer readable media storing instructions may be used. The instructions, when executed, may cause one or more apparatuses to perform one or more acts described herein. The one or more computer readable media may comprise transitory and/or non-transitory media. In addition, various signals representing data or events as described herein may be transferred between a source and a destination in the form of electromagnetic waves traveling through signal-conducting media such as metal wires, optical fibers, and/or wireless transmission media (e.g., air and/or space).

Modifications may be made to the various embodiments described herein by those skilled in the art. For example, each of the elements of the aforementioned embodiments may be utilized alone or in combination or sub-combination with elements of the other embodiments. It will also be appreciated and understood that modifications may be made without departing from the true spirit and scope of the present disclosure. The description is thus to be regarded as illustrative instead of restrictive on the present disclosure.

We claim:

1. An apparatus comprising:
a waveguide; and
two or more posts configured to move in parallel within a cavity of the waveguide.

2. The apparatus of claim 1, wherein the two or more posts extend into the cavity of the waveguide to about a same depth.

3. The apparatus of claim 1, wherein the two or more posts are inserted into the cavity of the waveguide through corresponding bores located on a same side of the waveguide.

4. The apparatus of claim 1, wherein the two or more posts are cylindrical and have a same diameter, and wherein the diameter and distance between the two or more posts are based on a frequency band in which the apparatus is configured to operate.

5. The apparatus of claim 1, wherein at least one of an orientation of a frequency response slope associated with the apparatus or an insertion loss of the apparatus is based on a depth to which the two or more posts extend into the cavity of the waveguide.

6. The apparatus of claim 1, wherein an insertion loss increases as an operating frequency increases when the two or more posts extend less than half way across the cavity.

7. The apparatus of claim 1, wherein an insertion loss decreases as an operating frequency increases when the two or more posts extend more than half way across the cavity.

8. The apparatus of claim 1, further comprising a motor configured to control movement of the two or more posts.

9. The apparatus of claim 1, further comprising a motor configured to:
receive, from a controller, one or more control signals associated with a particular distance; and
move the two or more posts to extend across the cavity by the particular distance.

10. The apparatus of claim 1, further comprising a power amplifier coupled to a port of the waveguide.

11. The apparatus of claim 1, further comprising a motor configured to move a plate coupled to the two or more posts.

12. The apparatus of claim 1, wherein the waveguide comprises a rectangular cavity and wherein the two or more posts are cylindrical posts having equal diameters.

13. A communication terminal comprising:
a power amplifier; and
an equalizer coupled to the power amplifier, wherein the equalizer comprises:
a waveguide; and
two or more posts configured to move in parallel within a cavity of the waveguide.

14. The communication terminal of claim 13, further comprising a controller configured to control an actuator to move the two or more posts to extend into the cavity by different amounts.

15. The communication terminal of claim 14, wherein the controller comprises a modem coupled to the power amplifier, wherein the modem is configured to transmit communication signals using the power amplifier.

16. The communication terminal of claim 14, wherein the controller is configured to:
receive information associated with a frequency response of the power amplifier;
determine a setting for the equalizer based on the information; and
control, based on the setting, the actuator to move the two or more posts.

17. The communication terminal of claim 16, wherein the information comprises information indicating a temperature.

18. A method comprising:
receiving, by a device, information; and
based on the information, causing two or more posts to move in parallel within a cavity of a waveguide.

19. The method of claim 18, wherein the causing comprises controlling, based on the information, a motor to move the two or more posts.

20. The method of claim 18, further comprising:
determining, based on the information, a setting,
wherein the causing comprises controlling, based on the setting, a motor to move the two or more posts to extend across the cavity by a particular distance.

* * * * *